(12) United States Patent
Tarabrin et al.

(10) Patent No.: US 10,598,483 B2
(45) Date of Patent: Mar. 24, 2020

(54) METROLOGY METHOD, APPARATUS AND COMPUTER PROGRAM

(71) Applicant: ASML Netherlands B.V., Veldhoven (NL)

(72) Inventors: Sergey Tarabrin, Eindhoven (NL); Simon Philip Spencer Hastings, Eindhoven (NL); Armand Eugene Albert Koolen, Nuth (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/683,010

(22) Filed: Aug. 22, 2017

(65) Prior Publication Data

US 2018/0073866 A1 Mar. 15, 2018

(30) Foreign Application Priority Data

Sep. 9, 2016 (EP) .................................... 16188176

(51) Int. Cl.
*G01B 11/27* (2006.01)
*G03F 7/20* (2006.01)

(52) U.S. Cl.
CPC ........ *G01B 11/272* (2013.01); *G03F 7/70591* (2013.01); *G03F 7/70633* (2013.01)

(58) Field of Classification Search
CPC G01B 11/272; G03F 7/70591; G03F 7/70633
USPC ................................................ 356/399–401
See application file for complete search history.

(56) References Cited

U.S. PATENT DOCUMENTS

| 6,034,378 | A | * | 3/2000 | Shiraishi | ................... | G03F 9/70 |
| | | | | | | 250/237 G |
| 6,130,750 | A | | 10/2000 | Ausschnitt et al. | | |
| 9,703,205 | B2 | * | 7/2017 | Neumann | ........... | G03F 7/70133 |

(Continued)

FOREIGN PATENT DOCUMENTS

WO WO 2009/078708 A1 6/2009
WO WO 2009/106279 A1 9/2009

(Continued)

OTHER PUBLICATIONS

International Search Report and Written Opinion of the International Searching Authority directed to related International Patent Application No. PCT/EP2017/070376, dated Oct. 24, 2017; 14 pages.

*Primary Examiner* — Isiaka O Akanbi
(74) *Attorney, Agent, or Firm* — Sterne, Kessler, Goldstein & Fox P.L.L.C.

(57) ABSTRACT

Disclosed is a method of determining a characteristic of a target on a substrate and corresponding metrology apparatus and computer program. The method comprises determining a plurality of intensity asymmetry measurements from pairs of complementary pixels comprising a first image pixel in a first image of the target and a second image pixel in a second image of the target. The first image is obtained from first radiation scattered by the target and the second image is obtained from second radiation scattered by the target, the first radiation and second radiation comprising complementary non-zero diffraction orders. The characteristic of the target is then determined from said plurality of intensity asymmetry measurements.

18 Claims, 8 Drawing Sheets

(56) References Cited

U.S. PATENT DOCUMENTS

| | | | |
|---|---|---|---|
| 2002/0149782 A1* | 10/2002 | Raymond | G01B 11/00 356/616 |
| 2003/0224261 A1* | 12/2003 | Schulz | G01B 11/272 430/22 |
| 2011/0027704 A1 | 2/2011 | Cramer et al. | |
| 2011/0043791 A1 | 2/2011 | Smilde et al. | |
| 2011/0292365 A1* | 12/2011 | Cramer | G01N 21/4785 355/67 |
| 2012/0038929 A1* | 2/2012 | Den Boef | G03F 7/70341 356/456 |
| 2012/0123581 A1 | 5/2012 | Smilde et al. | |
| 2012/0242970 A1 | 9/2012 | Smilde et al. | |
| 2013/0100427 A1 | 4/2013 | Koolen et al. | |
| 2014/0233025 A1* | 8/2014 | Den Boef | G03F 7/70341 356/237.5 |
| 2015/0138523 A1 | 5/2015 | Jak et al. | |
| 2015/0185625 A1 | 7/2015 | Chen et al. | |
| 2016/0033877 A1* | 2/2016 | Smilde | G03F 7/70483 356/399 |
| 2016/0086324 A1 | 3/2016 | Bozkurt et al. | |
| 2016/0117812 A1* | 4/2016 | Pandev | G06T 7/0004 382/149 |

FOREIGN PATENT DOCUMENTS

| | | |
|---|---|---|
| WO | WO 2011/012624 A1 | 2/2011 |
| WO | WO 2012/062858 A1 | 5/2012 |
| WO | WO 2015/018625 A1 | 2/2015 |

* cited by examiner

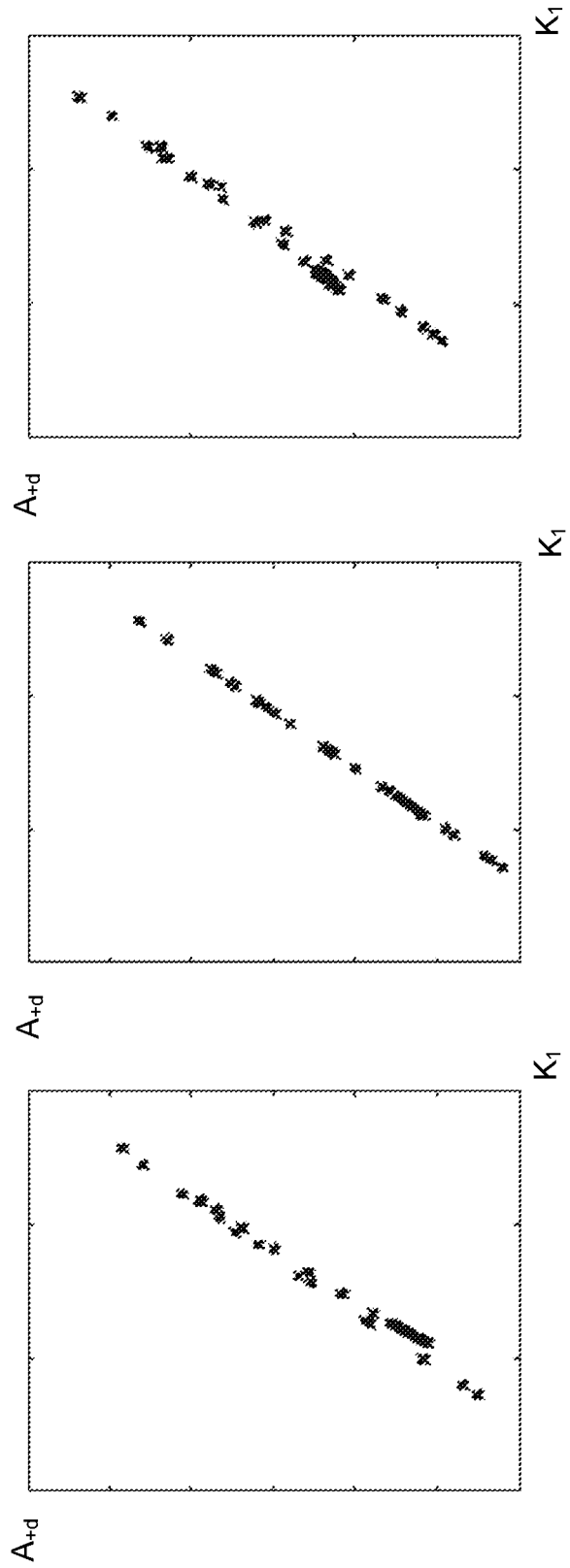

METROLOGY METHOD, APPARATUS AND COMPUTER PROGRAM

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

The targets used by conventional scatterometers are relatively large, e.g., 40 μm by 40 μm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 μm by 10 μm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120242970A. The contents of all these applications are also incorporated herein by reference. Diffraction-based overlay using dark-field detection of the diffraction orders enables overlay measurements on smaller targets. These targets can be smaller than the illumination spot and may be surrounded by product structures on a wafer. Targets can comprise multiple gratings which can be measured in one image.

In the known metrology technique, overlay measurement results are obtained by measuring an overlay target twice under certain conditions, while either rotating the overlay target or changing the illumination mode or imaging mode to obtain separately the $-1^{st}$ and the $+1^{st}$ diffraction order intensities. The intensity asymmetry, a comparison of these diffraction order intensities, for a given overlay target provides a measurement of target asymmetry, that is asymmetry in the target. This asymmetry in the overlay target can be used as an indicator of overlay (undesired misalignment of two layers).

When measuring thick stacks, where there may be a significant distance between the two layers being measured. This can make overlay determination using intensity asymmetry unreliable because the images obtained using the $-1^{st}$ and the $+1^{st}$ diffraction order intensities show no region of significant stable intensity from which an average can be taken. This can be addressed by determining overlay using a pupil plane image, but this requires very large targets and separate acquisitions for each target area.

SUMMARY OF THE INVENTION

It would be desirable to be able to perform overlay metrology using dark field methods on thick stacks.

The invention in a first aspect provides a method of determining a characteristic of a target on a substrate comprising: determining a plurality of intensity asymmetry measurements from pairs of complementary pixels comprising a first image pixel in a first image of the target and a second image pixel in a second image of the target, the first image having been obtained from first radiation scattered by the target and the second image having been obtained from second radiation scattered by the target, said first radiation and second radiation comprising complementary non-zero diffraction orders; and determining said characteristic of the target from said plurality of intensity asymmetry measurements.

The invention in a second aspect provides a metrology apparatus comprising: an illumination system configured to illuminate with radiation a target; a detection system configured to detect scattered radiation arising from illumination of the target; wherein said metrology apparatus is operable to perform the method of the first aspect.

The invention further provides a computer program comprising processor readable instructions which, when run on suitable processor controlled apparatus, cause the processor controlled apparatus to perform the method of the first aspect, and a computer program carrier comprising such a computer program.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which:

FIGS. 9(a)-9(c) are a plot of intensity asymmetry against the unnormalized stack sensitivity for (a) a first alignment, (b) a second alignment and (c) a third alignment of complementary images;

DETAILED DESCRIPTION OF EXEMPLARY EMBODIMENTS

Before describing embodiments of the invention in detail, it is instructive to present an example environment in which embodiments of the present invention may be implemented.

Figure 1:
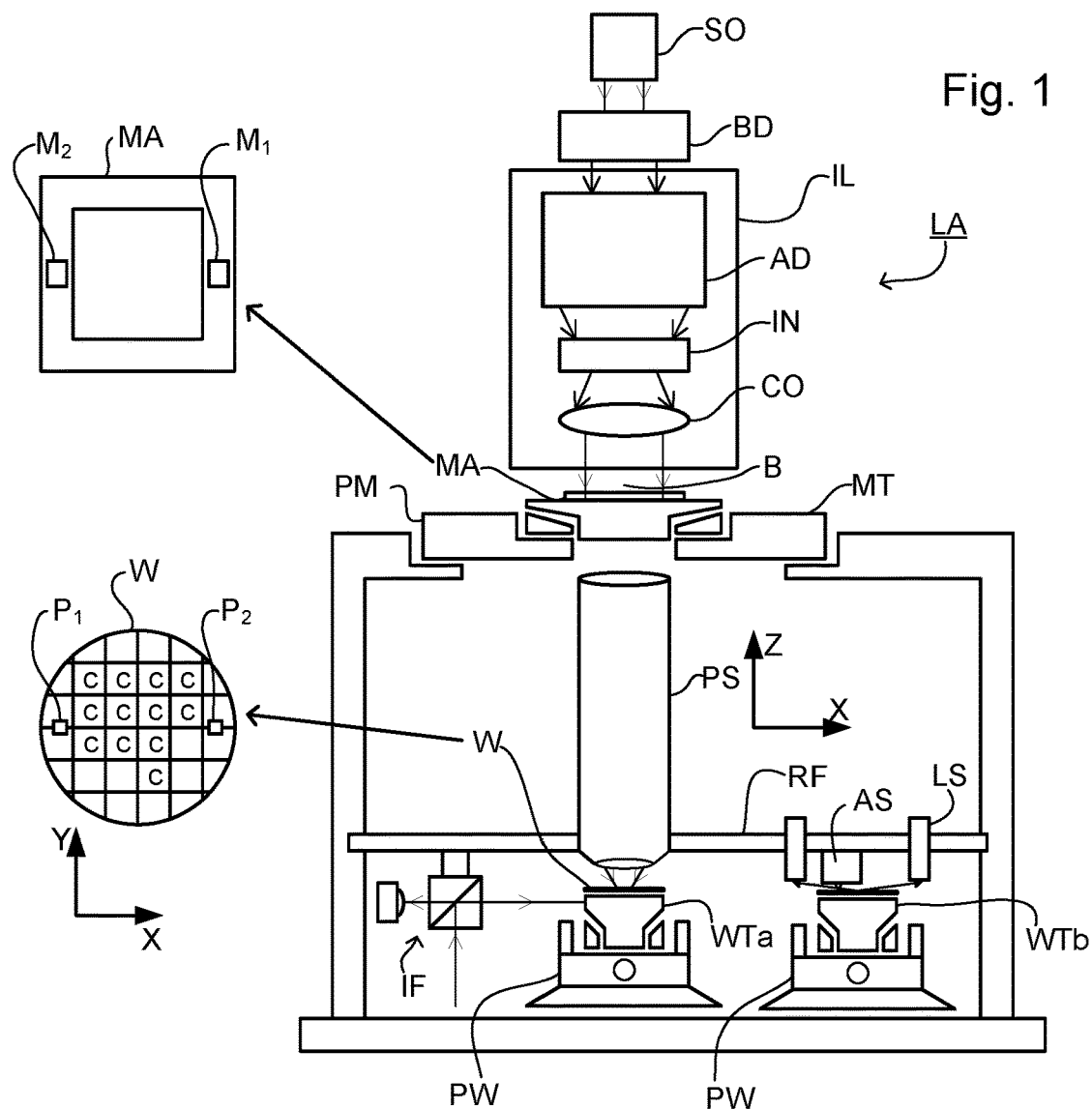
FIG. 1 depicts a lithographic apparatus according to an embodiment of the invention.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical or non-optical components, such as refractive, reflective, magnetic, electromagnetic, electrostatic or other types of components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 2:
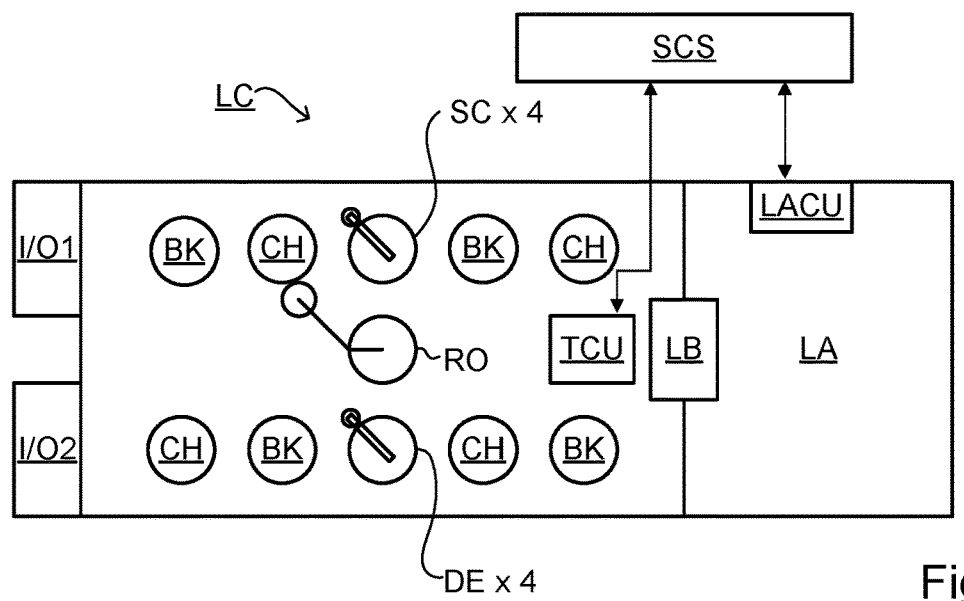
FIG. 2 depicts a lithographic cell or cluster according to an embodiment of the invention.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Figure 3A:
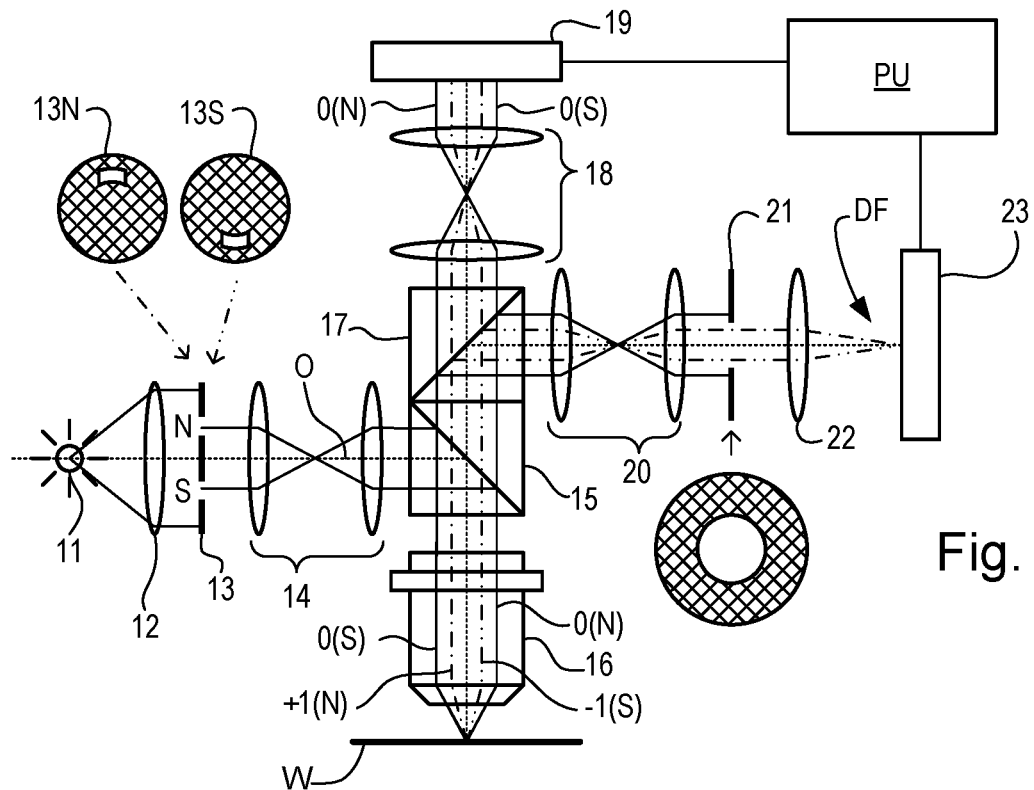
FIGS. 3(a)-3(d) comprise (a) a schematic diagram of a dark field scatterometer for use in measuring targets using a first pair of illumination apertures, (b) a detail of diffraction spectrum of a target grating for a given direction of illumination (c) a second pair of illumination apertures providing further illumination modes in using the scatterometer for diffraction based overlay measurements and (d) a third pair of illumination apertures combining the first and second pair of apertures.

A metrology apparatus is shown in FIG. 3(a). A target T and diffracted rays of measurement radiation used to illuminate the target are illustrated in more detail in FIG. 3(b). The metrology apparatus illustrated is of a type known as a dark field metrology apparatus. The metrology apparatus depicted here is purely exemplary, to provide an explanation of dark field metrology. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

Figures 3B, 3C, 3D:
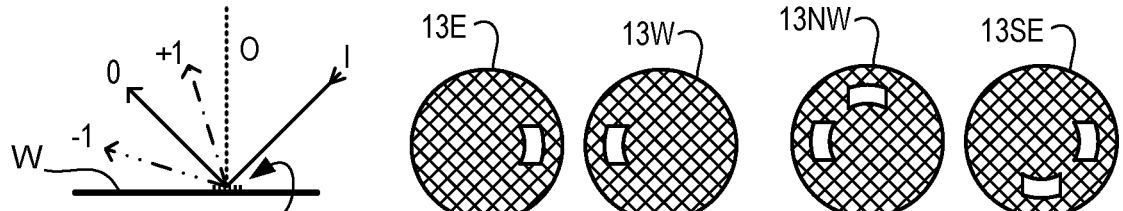

As shown in FIG. 3(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In other examples, a two quadrant aperture may be used. This may enable simultaneous detection of plus and minus orders, with optical wedges (or other suitable elements) in the detection branch to separate the orders for imaging. In yet other embodiments, $2^{nd}$, $3^{rd}$ and higher order beams (not shown in FIG. 3) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 3(c) and (d). The use of these, and numerous other variations and applications of the apparatus are described in prior published applications, mentioned above.

Figure 4:
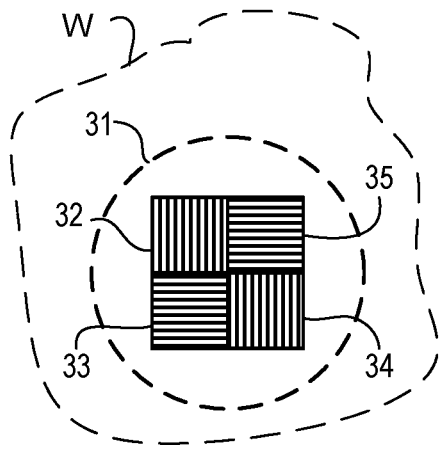
FIG. 4 depicts a known form of multiple grating target and an outline of a measurement spot on a substrate.

FIG. 4 depicts an overlay target or composite overlay target formed on a substrate according to known practice. The overlay target in this example comprises four sub-overlay targets (e.g., gratings) 32 to 35 positioned closely together so that they will all be within a measurement spot 31 formed by the metrology radiation illumination beam of the metrology apparatus. The four sub-overlay targets thus are all simultaneously illuminated and simultaneously imaged on sensor 23. In an example dedicated to measurement of overlay, sub-targets 32 to 35 are themselves composite structures formed by overlying gratings that are patterned in different layers of the semi-conductor device formed on substrate W. Sub-targets 32 to 35 may have differently biased overlay offsets in order to facilitate measurement of overlay between the layers in which the different parts of the composite sub-targets are formed. The meaning of overlay bias will be explained below with reference to FIG. 7. Sub-targets 32 to 35 may also differ in their orientation, as shown, so as to diffract incoming radiation in X and Y directions. In one example, sub-targets 32 and 34 are X-direction sub-targets with biases of the +d, −d, respectively. Sub-targets 33 and 35 are Y-direction sub-targets with offsets +d and −d respectively. Separate images of these sub-targets can be identified in the image captured by sensor 23. This is only one example of an overlay target. An overlay target may comprise more or fewer than 4 sub-targets.

Figure 5:
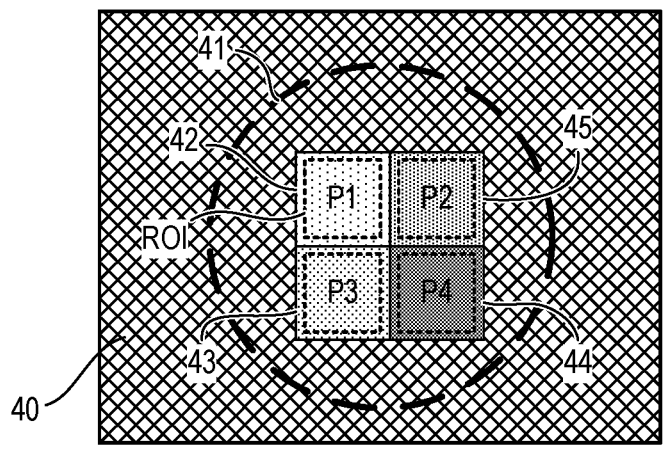
FIG. 5 depicts an image of the target of FIG. 4 obtained in the scatterometer of FIG. 3.

FIG. 5 shows an example of an image that may be formed on and detected by the sensor 23, using the overlay target of FIG. 4 in the apparatus of FIG. 3, using the aperture plates 13NW or 13SE from FIG. 3(d). While the pupil plane image sensor 19 cannot resolve the different individual sub-targets 32 to 35, the image sensor 23 can do so. The hatched area 40 represents the field of the image on the sensor, within which the illuminated spot 31 on the substrate is imaged into a corresponding circular area 41. Within this, rectangular areas 42-45 represent the images of the small overlay target sub-targets 32 to 35. If the overlay targets are located in product areas, product features may also be visible in the periphery of this image field. Image processor and controller PU processes these images using pattern recognition to identify the separate images 42 to 45 of sub-targets 32 to 35. In this way, the images do not have to be aligned very precisely at a specific location within the sensor frame, which greatly improves throughput of the measuring apparatus as a whole.

Once the separate images of the overlay targets have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Figure 6:
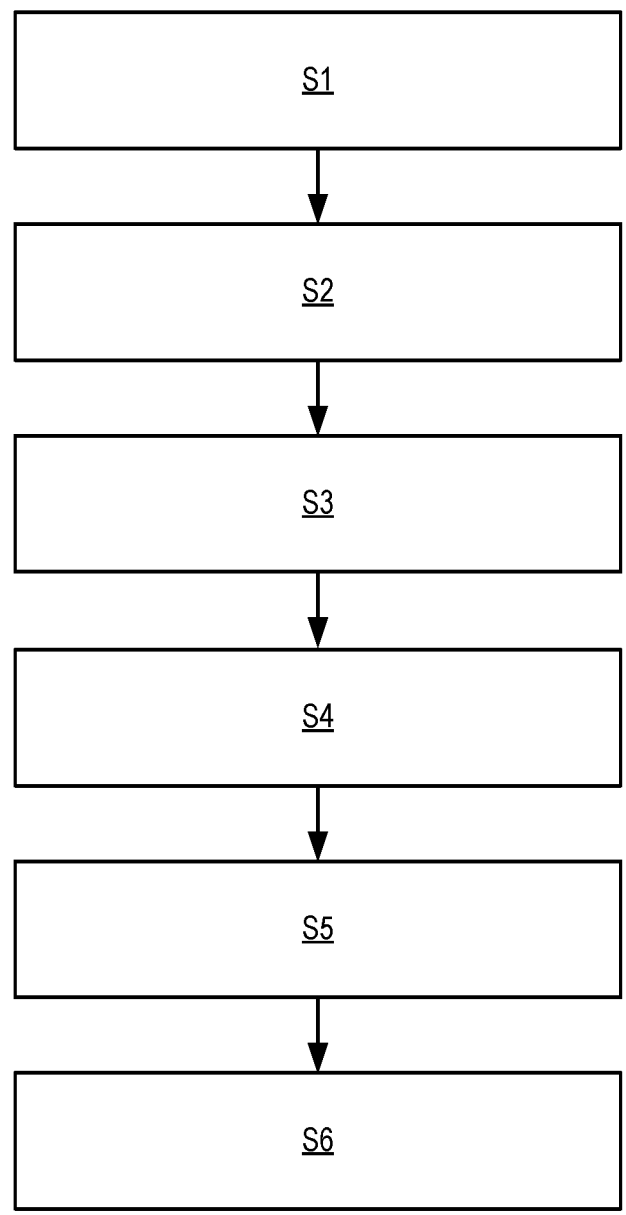
FIG. 6 is a flowchart showing the steps of an overlay measurement method using the scatterometer of FIG. 3.

FIG. 6 illustrates how, using for example the method described in application WO 2011/012624, overlay error (i.e., undesired and unintentional overlay misalignment) between the two layers containing the sub-targets 32 to 35 is measured. Such a method may be referred to as micro diffraction based overlay (μDBO). This measurement is done through overlay target asymmetry, as revealed by comparing their intensities in the +1 order and −1 order dark field images (the intensities of other corresponding higher orders can be compared, e.g. +2 and −2 orders) to obtain a measure of the intensity asymmetry. At step S1, the substrate, for example a semiconductor wafer, is processed through a lithographic apparatus, such as the lithographic cell of FIG. 2, one or more times, to create an overlay target including the sub-targets 32-35. At S2, using the metrology apparatus of FIG. 3, an image of the sub-targets 32 to 35 is obtained using only one of the first order diffracted beams (say −1). At step S3, whether by changing the illumination mode, or changing the imaging mode, or by rotating substrate W by 180° in the field of view of the metrology apparatus, a second image of the overlay targets using the other first order diffracted beam (+1) can be obtained. Consequently the +1 diffracted radiation is captured in the second image.

Note that, by including only half of the first order diffracted radiation in each image, the 'images' referred to here are not conventional dark field microscopy images. The individual overlay target lines of the overlay targets will not be resolved. Each overlay target will be represented simply by an area of a certain intensity level. In step S4, a region of interest (ROI) is identified within the image of each component overlay target, from which intensity levels will be measured.

Having identified the ROI for each individual overlay target and measured its intensity, the asymmetry of the overlay target, and hence overlay error, can then be determined. This is done (e.g., by the processor PU) in step S5 comparing the intensity values obtained for +1 and −1 orders for each sub-target 32-35 to identify their intensity asymmetry, e.g., any difference in their intensity. The term "difference" is not intended to refer only to subtraction. Differences may be calculated in ratio form. In step S6 the measured intensity asymmetries for a number of overlay targets are used, together with knowledge of any known imposed overlay biases of those overlay targets, to calculate one or more performance parameters of the lithographic process in the vicinity of the overlay target T. A performance parameter of great interest is overlay.

Measurement of overlay targets using diffractive metrology methods such as those described above is more accurate for thinner stacks, where the distance (in the z-direction perpendicular to the substrate plane) between the two layers being measured is not too large. Measurement of thicker stacks presents greater difficulty. Due to non-normal propagation of light, along multiple diffraction paths through a target of finite thickness between top and bottom gratings, the gratings will not be properly aligned and therefore effectively displaced relative to each other. These displacements are smeared out due to the illumination arriving from multiple angles within a finite area aperture. As a consequence, different points in the image plane (the plane imaged by the detector—e.g., detector 23 in FIG. 3) carry different information regarding intersections of the grating images, and thus stack sensitivity becomes a rapidly varying function of position in the image plane. In a thin target, this effect only affects the image edge. Therefore, the ROI is identified as an area away from the edge within the image, where the measured intensity shows very little spatial variation. However, with thicker stacks, this effect occurs not only at the edge of the target image, but throughout the whole target image. The average asymmetry signal over the image has very little stack sensitivity due to rapid sign variation of the stack sensitivity within any chosen ROI area, while individual pixels have considerably greater stack sensitivity. This results in a very inaccurate overlay estimation. Stack sensitivity describes the change in asymmetry signal between the sub-targets, normalized by the average of their intensity scaled by the bias target d. In a specific example, normalized stack sensitivity $K_1S$ is described by:

$$K_1/S = \frac{A_{+d} - A_{-d}}{I_{av}2/d}$$

where +d and −d are the imposed sub-target biases (having magnitude d), $A_{+d}$ is an asymmetry measurement (intensity difference) from complementary images of the +d sub-target and $A_{-d}$ is an asymmetry measurement (intensity difference) from complementary images of the −d sub-target. $I_{av}$ is the average of the intensity measurements of both sub-targets +d, −d, for both the +1 and −1 diffraction orders.

For thick stacks there is no sufficiently large ROI for which an average will result in a strong and stable stack sensitivity. Additionally, current image recognition algorithms work by identifying uniform regions, but in thick stacks the boundaries around the target become smooth and washed out, making ROI detection difficult.

Figure 7A:
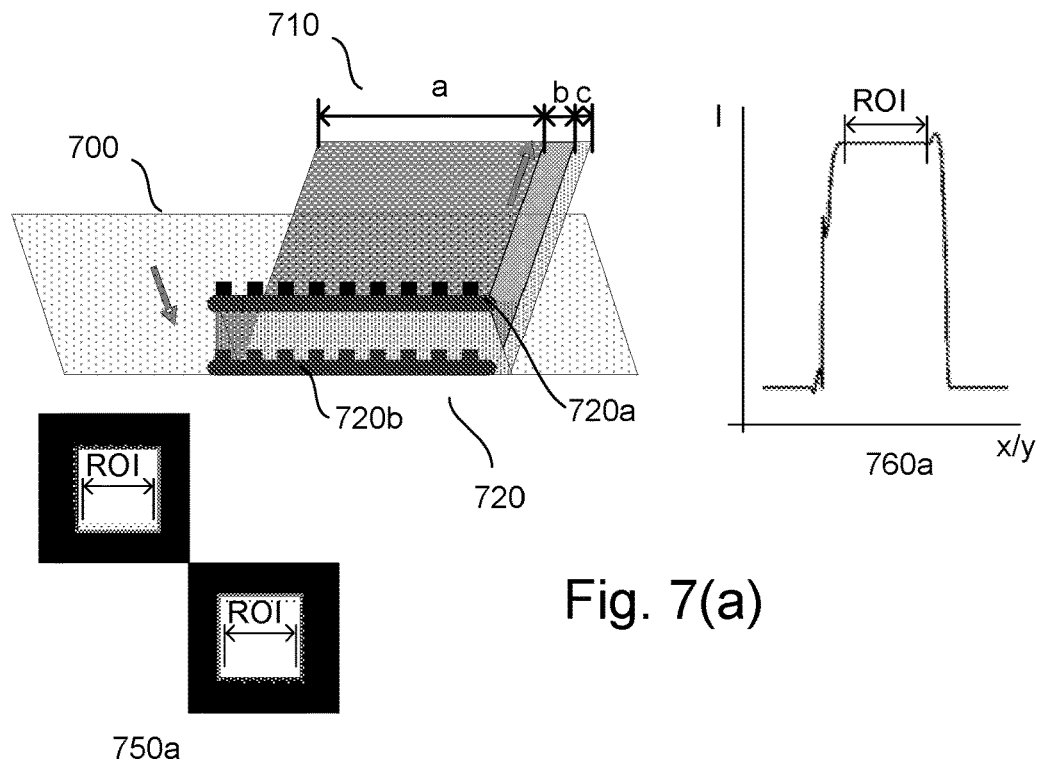
FIGS. 7(a)-7(b) show exemplary optical paths of measurement radiation through (a) a thin target and (b) a thick target, and corresponding images and intensity plots.
Figure 7B:
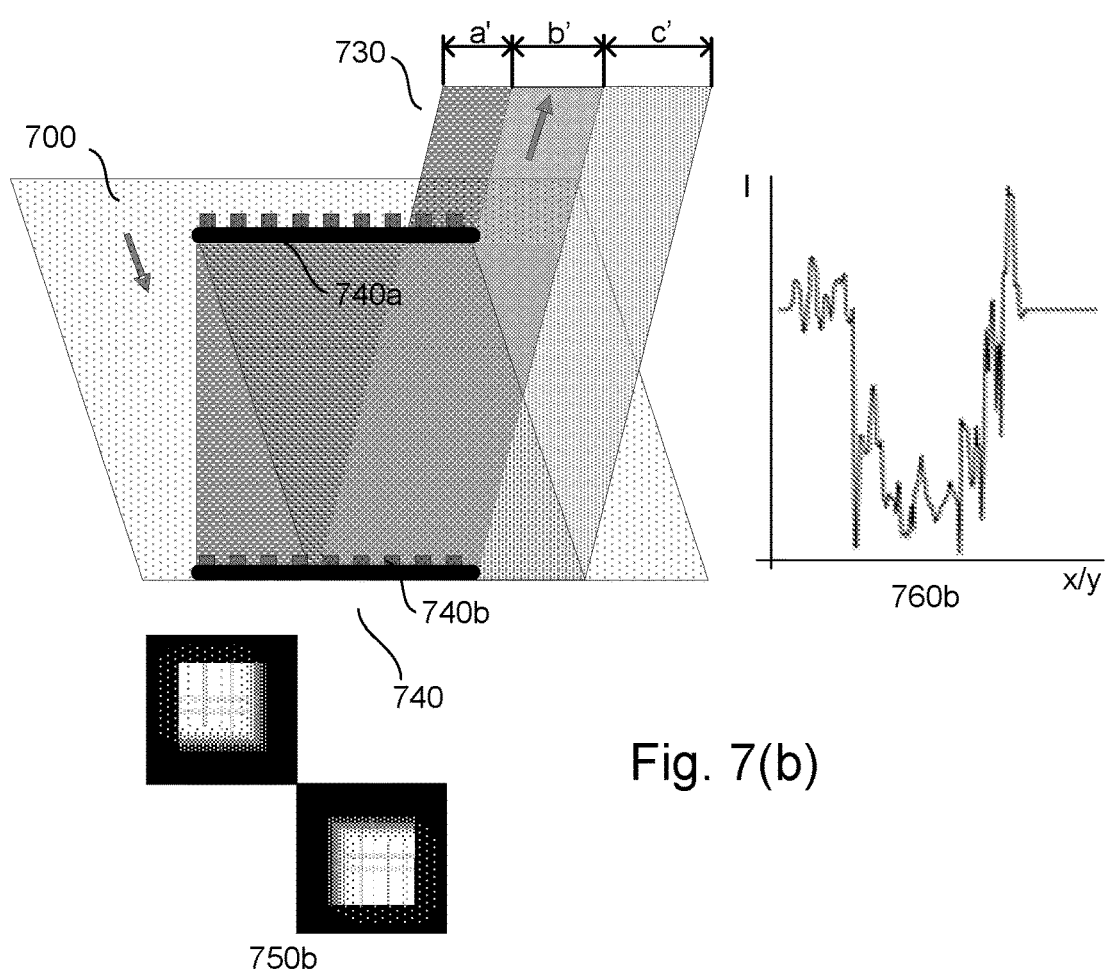

FIG. 7 illustrates this effect. FIG. 7(a) shows incident measurement radiation 700 and scattered radiation 710 following illumination of a thin target 720 (e.g., thickness smaller than the 1λ, 2λ, 3λ, 4λ, or 5λ—where λ is the wavelength of the measurement radiation) comprising a top grating 720a and bottom grating 720b. For clarity, only a single path is shown, although there will be multiple paths in reality. FIG. 7(b) shows incident measurement radiation 700 and scattered radiation 730 following illumination of a thick target 740 (e.g., a thick target may be defined as having a thickness greater than the 1λ, 2λ, 3λ, 4λ, or 5λ, or greater than 1 μm, 2 μm, 3 μm, 4 μm, 5 μm) comprising a top grating 740a and bottom grating 740b. In each case, the resultant captured image 750a, 750b and a corresponding graph 760a, 760b of intensity asymmetry against position (in x or y) for the measured scattered radiation is shown.

In both drawings, for clarity, only a single path is shown, although there will be multiple paths in reality. Many different optical paths arise because of successive diffraction events at the top grating 720a, 740a, then at the bottom grating 720b, 740b, and again at the top grating 720a, 740a, the radiation possibly diffracting at different angles at each diffraction event. Therefore, optical paths inside the target, other than that shown, exist and behave similarly (i.e. there will be regions with no overlap, regions with top-bottom overlap, and regions with top-bottom-top overlap). Also, there will be some radiation reflecting from the top grating, resulting in a further region which partially overlaps with region a, a', and which carries overlay signal only in the overlap region.

In FIG. 7(a), the scattered radiation 710 has been divided into regions labelled a, b and c depending on the path of the radiation through the target. The largest region, labeled a, results from measurement radiation 700 having taken a path through the top grating 720a, onto the bottom grating 720b and back through the top grating 720a. As the radiation in this region has been subject to the same scattering structures and is relatively large with relation to the image, its intensity will be relatively stable over the region, as shown by the region of the image 750a and graph 760a labeled ROI. The region labeled b results from measurement radiation 700 having taken a path through the top grating 720a, onto the bottom grating 720b, but not through the top grating 720a again. As both of these regions a, b are scattered by both the top grating 720a and bottom grating 720b, they will each contain overlay information. The region labelled c has been scattered by the top grating 720a only, and therefore comprises no overlay information.

FIG. 7(b) shows the equivalent situation for a thick target. It can be seen that the region a' is much smaller than the equivalent region a in FIG. 7(a). Also, the region c', which comprises no overlay information, is much larger than the equivalent region c in FIG. 7(a). Due to the aperture being finite in size, the incident measurement radiation 700 arrives at the target at multiple angles of incidence, meaning that the resultant image is smeared (spread out) along the propagation direction of the measurement radiation, the distance between the gratings exacerbating this spreading. The multiple optical paths (due to multiple diffraction angles) following each diffraction event further complicates the image of the target. The result of this is illustrated by the image 750b, which shows this spreading out of the intensity in the x/y diagonal, and in the graph 760b where it can be seen that there is no region of stable intensity, and therefore no good ROI from which an average can be taken. Note that the direction of spreading in image 750b is dependent on the metrology apparatus and aperture configuration, for other metrology apparatuses and aperture configurations, the spreading may be in a different direction; for example along the grating axis (e.g., x-axis for an x-grating).

Instead of averaging over an ROI and subtracting the averaged intensities, it is proposed that the intensities of pairs of complementary pixels from the normal and complementary images are subtracted. Such a field resolved overlay measurement has a number of advantages over the known technique described. As before, the normal and complementary images may comprise +1 order and −1 order dark field images (or images of other complementary higher orders).

The field plane image has the property that each point in the +1 order image represents the same optical path lengths through the target structure as the corresponding, rotational symmetric point in the −1 order. As such, complementary pixels may comprise pixels from complementary (e.g. +1 and −1 diffraction) images from which the radiation paths through the target structure responsible for the measured pixel intensity are equivalent or rotational symmetric and therefore have the same path lengths. The rotational symmetry may be symmetry around the optical axis of the metrology apparatus sensor, or an axis parallel to this in the case where each of the sub-targets are imaged non-centrally (as illustrated in FIG. 5). As a result, the above effects resulting from the apparent offset of the two gratings can be removed by treating each pixel as a separate overlay measurement, in principle. This results in a collection of overlay measurements, each with associated stack sensitivity. To obtain best symmetry of corresponding complementary paths through the target structure, it is preferred that the measurement radiation is focused on the top grating of the target structure for each measurement.

There are additional benefits to such a method. Firstly, all other effects which result in symmetric disturbance of the optical paths in the +1 and −1 orders should be suppressed with the proposed method. These may include image distortions due to defocus (e.g., intensity slopes) which can result in additional inaccuracy of the overlay estimation when intensities are averaged over the ROI in the conventional method. Other sensor asymmetries may also be cancelled.

A further advantage is that such a method effectively yields plural simultaneous measurements of asymmetry with stack sensitivity varying significantly across the measurements. It is known that intensity asymmetry A (i.e., the difference between normal and complementary intensity measurements) can be calculated as:

$$A = K_0 + K_1 \sin OV \quad \text{(Equation 1)}$$

where $K_1$ is a the unnormalized stack sensitivity and $K_0$ is a term dependent on the amount of process asymmetry there is in the target. Process asymmetry is not related to overlay, but instead results from processing of the target. Such processing can cause one of the gratings (usually the bottom grating) to be asymmetrical by itself, e.g., by having a floor tilt (non-horizontal floor) or an offset in side wall angle between the walls making up each trough of the grating. Note that the overlay OV can be assumed very small and therefore the approximation sin OV=OV may be made. $K_0$, $K_1$ and OV are all unknown and require determination from the asymmetry measurements.

By the known method of FIG. 6, two asymmetry values are determined, from two gratings of different biases (e.g., biases of +d and −d). Since the stack sensitivity within the ROI area is stable for thin stacks, i.e. have a relatively fixed single value, a linear fitting to determine the $K_0$ is not feasible in a single capture. Multiple captures (e.g., using different wavelengths/polarizations) need to be performed, as stack sensitivity varies with measurement wavelength and polarization. However, in the method described herein, multiple simultaneous measurements of asymmetry with variable stack sensitivity are obtained, yielding multiple points to remove mixing between $K_0$ and overlay OV, enabling a linear regression, and therefore determination of $K_0$ and OV in a single capture.

Figure 8:
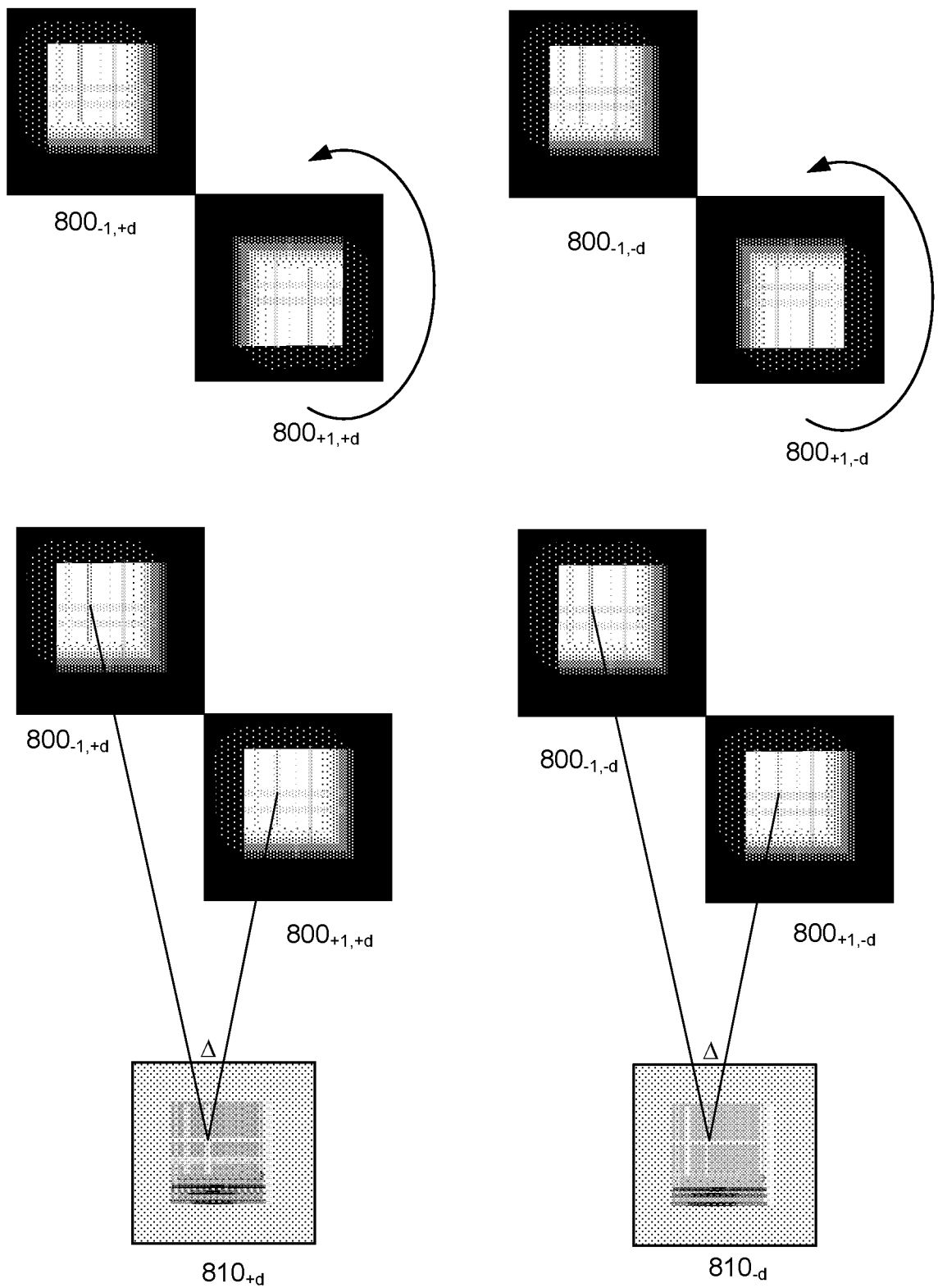
FIG. 8 is a schematic diagram illustrating a method of determining overlay according to an embodiment of the invention.

FIG. 8 conceptually illustrates the proposed method. A compound target comprising at least two sub-targets with different biases (e.g., +d, −d) are measured using complementary higher orders (e.g., +1 and −1 orders), to obtain images $800_{+1,+d}$, $800_{-1,-d}$, $800_{-1,-d}$, $800_{+1,-d}$. This may be achieved by performing steps S1, S2 and S3 of FIG. 6. Following this, one of each complementary pair of images is rotated and "aligned" to the other of the complementary pair of images. For example, image $800_{+1,-d}$ may be rotated and aligned to image $800_{-1,+d}$, and image $800_{+1,-d}$ may be rotated and aligned to image $800_{-1,-d}$. The purpose of alignment is to identify pairs of symmetric pixels in the +1 and −1 diffraction order images, that is pixels for which the radiation sensed has taken identical optical paths through the target. Once the complementary pair of images are aligned, the intensity difference of complementary (e.g., symmetric) individual pixels are calculated, to obtain plural asymmetry measurements per pixel, represented by asymmetry images $810_{-d}$, $810_{-d}$. Overlay OV can be calculated in the same way as when using averaged intensity values, e.g.:

$$OV = d\frac{A_{+d} + A_{-d}}{A_{+d} - A_{-d}} \quad \text{(Equation 2)}$$

where +d and −d are the imposed biases (having magnitude d), $A_{+d}$ is an asymmetry measurement (intensity difference) of complementary individual pixels from complementary images of the +d target and $A_{-d}$ is an asymmetry measurement (intensity difference) of complementary individual pixels from complementary images of the −d target. This calculation is therefore performed per pixel, rather than once for single averaged values, to obtain plural per-pixel overlay values.

While it conceptually helps to envision the process as actually rotating one image and aligning it with its complementary image, this process may not literally comprise such steps. What is important is that asymmetry measurements are calculated on a per-pixel basis from complementary (e.g., rotational-symmetric) pixels. To do this, the relative positional offset between the two images needs to be optimized. It is within the scope of this disclosure to literally align the images, for example using image registration or edge finding/modelling algorithms or similar. Fourier methods are also envisaged. In principle, the expected alignment of the targets could also be known from the target layout. Consequently, there is some prior information that could be used: the difference in positions may be known from the reticle, and the alignment therefore needs only to determine where the optical axis is relative to the target. However, it may be difficult to align to the required sub-pixel resolution using such methods. Also, it may be that a visual alignment does not actually yield the best offset.

To optimize the relative positional offset between the two images, it is proposed to perform a regression through a plot of $A_{+d}$ or $A_{-d}$ against the unnormalized stack sensitivity coefficient $K_1$; or a plot of $A_{+d}$ against $A_{-d}$, for a number of different (trial) image offsets. Unnormalized stack sensitivity $K_1$ is known to be a function of the trial alignment. In an embodiment, the optimized offset is the one for which the plot yields the most linear regression. When different offsets are tried, $K_1$, $A_{-d}$ and $A_{+d}$ change, enabling the most linear relationship between two of these parameters to be determined. Where $K_1$ is used, it may be determined per pixel by:

$$K_1 = (A_{+d} - A_{-d})/(2d) \quad \text{(Equation 3)}$$

As an alternative to finding the most linear relationship, the plot which yields a regression which best fits another function may be chosen. In particular, the linear fit described is actually an approximation of a sin relationship over a small range in the linear region. As such, the plot which best fits a sin relationship may be chosen for the best alignment. Alternatively, the best fit to other functions (e.g., a quadratic relationship) may be chosen. When optimizing the offset (regardless of function being fitted), an exhaustive search strategy may be employed. In alternative embodiments, a greedy search strategy or other optimization approach to finding the best offset may be employed. Additional data points for each plot may be included; for example, obtaining additional measurements with a different measurement recipe (wavelength and/or polarization) would double the number of points to be plotted enabling a better fitting.

FIG. 9 illustrates this offset optimization method. FIG. 9(a) shows a plot of $A_{+d}$ against $K_1$ for a first relative offset between complementary images, FIG. 9(b) shows a corresponding plot for a second relative offset between complementary images, and FIG. 9(c) shows a plot of for a third relative offset between complementary images. In this specific example, the optimized relative offset is that illustrated in FIG. 9(b). This shows a very linear regression, with the other two plots being less linear. The difference in relative offset between the plots may be smaller than a pixel, for example one or two tenths of a pixel, enabling the offset optimization to be performed within an accuracy substantially smaller than a single pixel. In an embodiment, a cost function can be devised which minimizes the residual error (for example a mean-squared error or estimated variance of the slope) between a linear regression and the data points, over a range of relative offsets between the complementary images.

Figure 10A:
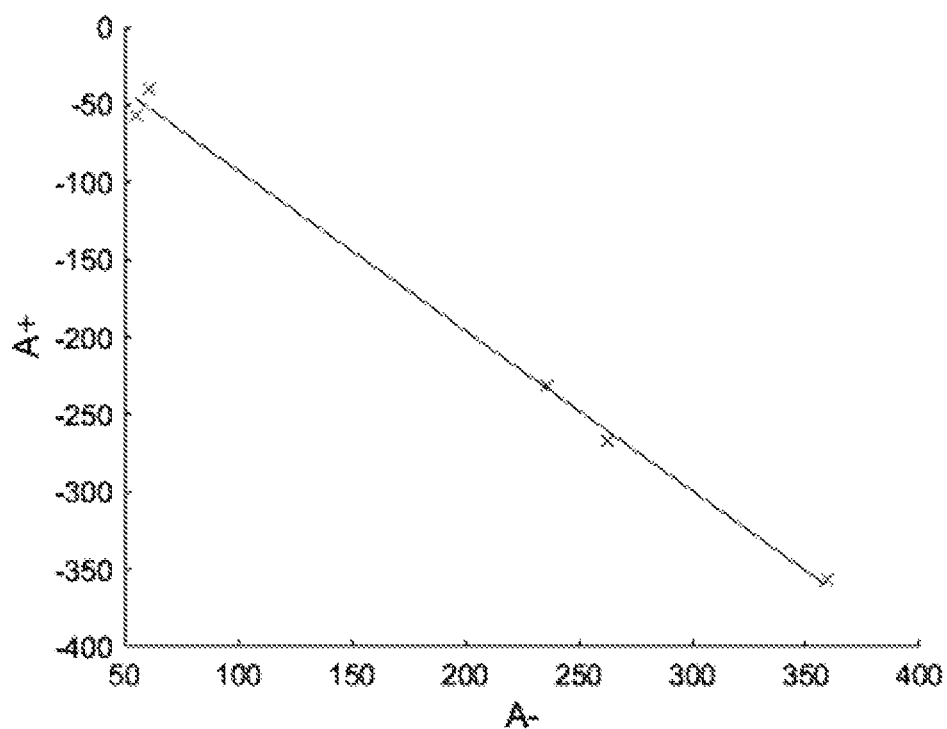
FIGS. 10(a)-10(b) are a plot of (a) intensity asymmetry in the +d sub-target against intensity asymmetry in the −d sub-target and (b) intensity asymmetry in the +d sub-target against the unnormalized stack sensitivity.

Once the image offset is optimized, the overlay value can be determined from the slope of the linear fit from the plot of $A_{+d}$ against $A_{-d}$; or of $A_{+d}$ or $A_{-d}$ against the sensitivity coefficient $K_1$. It can be shown that an accurate overlay value will be given by this slope. FIG. 10 shows (a) an exemplary plot of $A_{+d}$ against $A_{-d}$, and (b) an exemplary plot of $A_{+d}$ against $K_1$, in each case with a linear fitting to 5 data points. For the $A_{+d}$ against $A_{-d}$ plot of FIG. 10(a), the equation to fit is:

$$A_{+d} = A_{-d} m + c \quad \text{(Equation 4)}$$

where m is the slope of the line and C is the offset. It can therefore be shown that the overlay OV can be calculated by:

$$OV = d * \frac{m+1}{m-1} \quad \text{(Equation 5)}$$

Figure 10B:
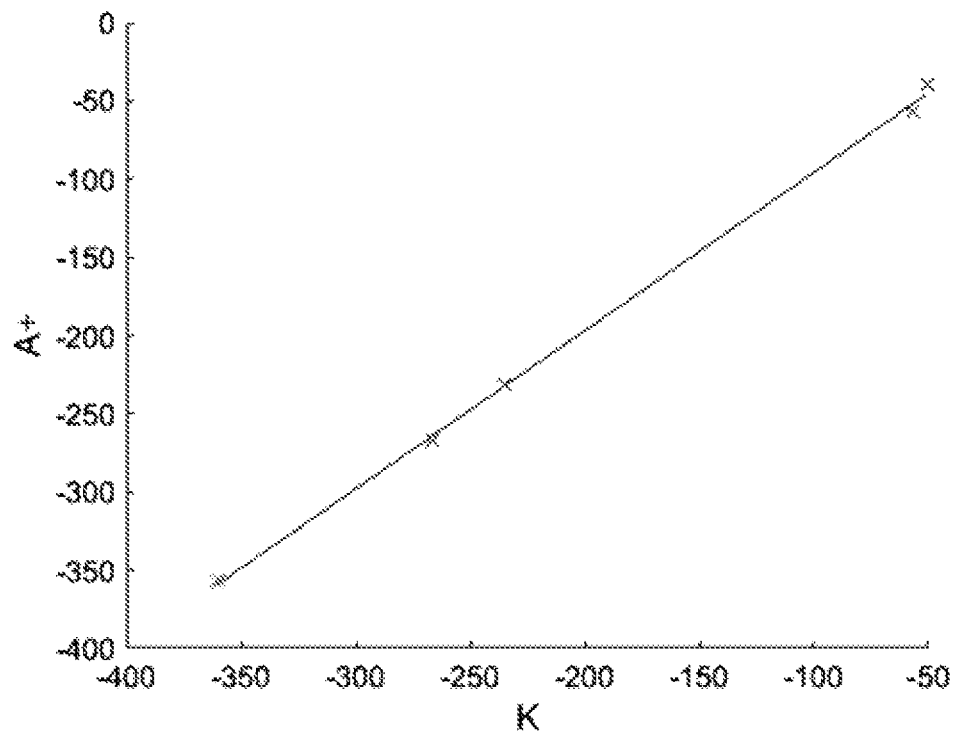

For the $A_{+d}$ against $K_1$ plot of FIG. 10(b), the equation to fit is:

$$A_{+d} = K_1 M + C \quad \text{(Equation 6)}$$

It can therefore be shown (using Equation 3 to substitute for $K_1$) that the overlay OV can be calculated by:

$$OV = M - d$$

Figure 11:
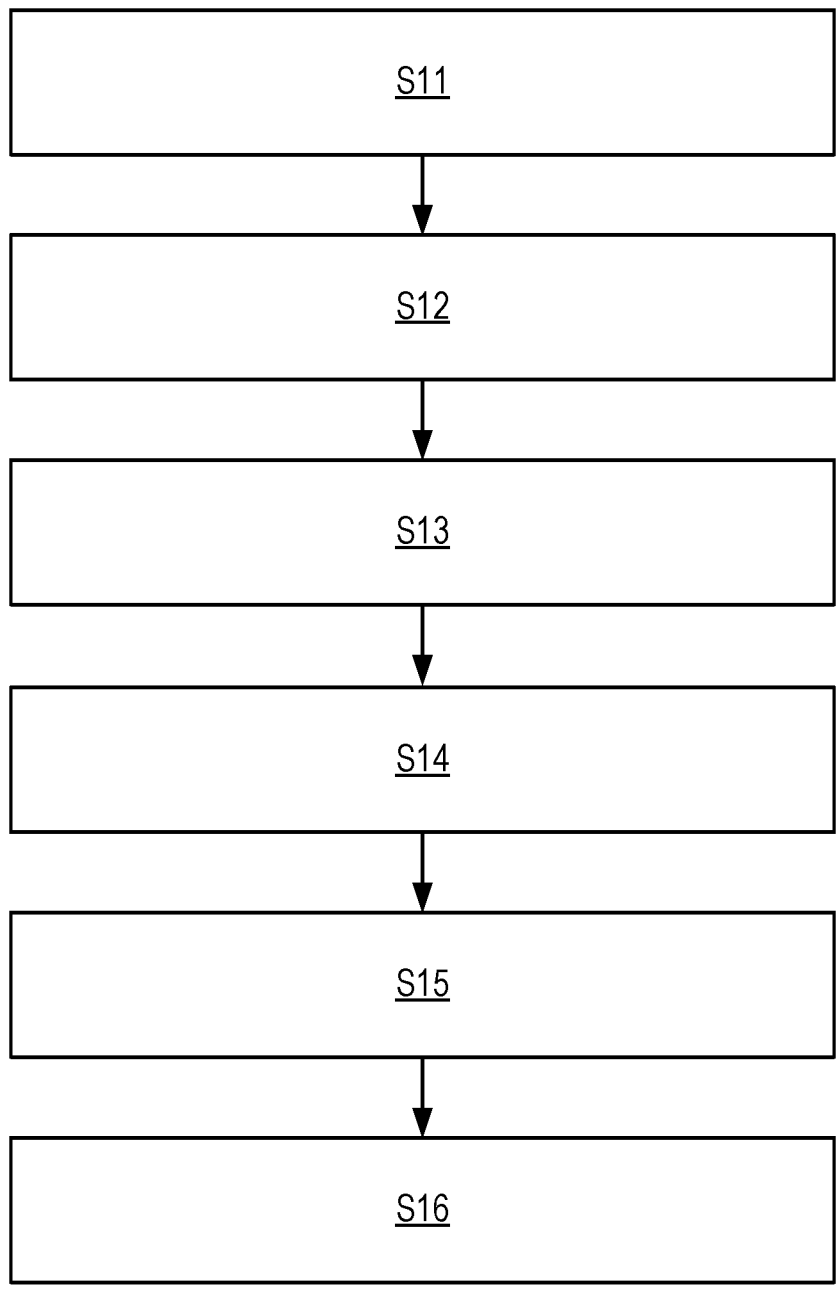
FIG. 11 is a flowchart describing a method of determining overlay according to an embodiment of the invention.

FIG. 11 is a flowchart of an exemplary method of measuring overlay using the techniques described herein. At step S11, the substrate, for example a semiconductor wafer, is processed through a lithographic apparatus, such as the lithographic cell of FIG. 2, one or more times, to create an overlay target. At S12, using the metrology apparatus of e.g., FIG. 3, a first (normal) image of the overlay targets is obtained using first radiation which comprises only one of the first/higher order diffracted beams (e.g., +1). At step S13, a second (complementary) image of the overlay targets using second radiation which comprises the other first/higher order diffracted beam (e.g., −1) is obtained. Steps S12 and S13 may be performed simultaneously (e.g., by using optical wedges to separate the diffracted orders). Steps S11-S13 correspond to steps S1 to S3 of FIG. 6.

At step S14, the asymmetry of the overlay target, and hence overlay error, is determined for (possible) pairs of complementary (symmetrical) pixels comprising a first image pixel from said first image and a second image pixel from said second image. This may be done (e.g., by the processor PU) by comparing the intensity values obtained for +1 and −1 orders for each overlay sub-target 32-35 to identify their intensity asymmetry, e.g., any difference in their intensity, on a per pixel basis. The term "difference" is not intended to refer only to subtraction. Differences may be calculated in ratio form. In a particular embodiment, this is done for a number of possible alignments of the first image and second image. In other embodiments, an offset optimization step (see S15) aligning the normal and complementary images may be performed before this step (e.g., using image registration techniques or similar), and this step performed once with the optimized offset.

At step S15, the relative offset between the normal and complementary images is optimized for each individual target (e.g., where the target is as illustrated in FIG. 4, for each of sub-targets 32, 33, 34, 35). In an embodiment, the offset optimization step may comprise determining (e.g., per direction) the relationship between the intensity asymmetry measurements for some or all pairs of complementary pixels of the images from one sub-target (e.g., the +d image) with either the sensitivity coefficient $K_1$ or the intensity asymmetry measurements for the same pixels of the images from the other target (e.g., the −d image), for different trial offsets (relative shifts) between the normal and complementary images (e.g., as determined in step S14). The offset for which the determined relationship is most linear may be selected as the optimized offset.

At step S16, the overlay is determined using the measured per-pixel intensity asymmetries and knowledge of the known biases. In an embodiment, the overlay may be determined from the slope of the linear relationship determined at step S15. Other methods of determining overlay are also possible, for example performing a per-pixel calculation using Equation 2 on the aligned images. Additionally, the distribution (e.g., a histogram) of each calculated per-pixel overlay over an overlay range can be determined, with the most common overlay value selected as the actual overlay.

While the targets described above are metrology targets specifically designed and formed for the purposes of measurement, in other embodiments, properties may be measured on targets which are functional parts of devices formed on the substrate. Many devices have regular, grating-like structures. The terms 'target grating' and 'target' as used herein do not require that the structure has been provided specifically for the measurement being performed. Further, pitch P of the metrology targets is close to the resolution limit of the optical system of the scatterometer, but may be much larger than the dimension of typical product features made by lithographic process in the target portions C. In practice the lines and/or spaces of the overlay gratings within the targets may be made to include smaller structures similar in dimension to the product features.

In association with the physical grating structures of the targets as realized on substrates and patterning devices, an embodiment may include a computer program containing one or more sequences of machine-readable instructions describing methods of measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the steps S14-S16 and so calculate overlay error.

The program may optionally be arranged to control the optical system, substrate support and the like to perform the steps S12-S15 for measurement of asymmetry on a suitable plurality of targets.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of components, including refractive, reflective, magnetic, electromagnetic and electrostatic components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of determining a characteristic of a target on a substrate comprising:
   determining a plurality of intensity asymmetry measurements, wherein each of the plurality of intensity asymmetry measurements is determined from measured intensities from a respective one of pairs of complementary pixels without averaging the measured intensities,
   wherein each of the pairs of complementary pixels comprises a first image pixel in a first image of the target and a second image pixel in a second image of the target,
   wherein the first image is obtained from first radiation scattered by the target and the second image is obtained from second radiation scattered by the target, and
   wherein the first radiation and second radiation comprise complementary non-zero diffraction orders; and
   determining the characteristic of the target using the plurality of intensity asymmetry measurements of the pairs of complementary pixels.

2. The method of claim 1, wherein the characteristic of the target comprises overlay.

3. The method of claim 1, further comprising:
   optimizing a relative positional offset between the first image and the second image to identify the pairs of complementary pixels.

4. The method claim 3, wherein the optimizing is such that optical path lengths through the target traveled by the first radiation to form the first image pixel of a pair of complementary pixels and optical path lengths through the target traveled by the second radiation to form the second image pixel of the pair of complementary pixels are same.

5. The method claim 4, wherein the optimizing is such that optical paths through the target traveled by the first radiation to form the first image pixel of a pair of complementary pixels and optical paths through the target traveled by the second radiation to form the second image pixel of the pair of complementary pixels are symmetrical.

6. The method of claim 1, wherein the optimizing comprises:
    determining a relationship between the plurality of intensity asymmetry measurements and a sensitivity coefficient of the target for a plurality of trial offsets of the first image and the second image; and
    selecting an offset for which the relationship best fits a particular function.

7. The method of claim 6, wherein the particular function comprises a linear function.

8. The method of claim 7, wherein the determining the characteristic of the target comprises determining the characteristic of the target from a slope of the linear function.

9. The method of claim 3, wherein the target comprises a first sub-target with a first bias and a second sub-target with a second bias, and the optimizing comprises:
    determining a relationship between the plurality of intensity asymmetry measurements from the first sub-target and the plurality of intensity asymmetry measurements from the second sub-target for a plurality of trial offsets; and
    selecting an offset for which the relationship best fits a particular function.

10. The method of claim 1, further comprising:
    determining an intensity asymmetry contribution resultant from process asymmetry in the target, wherein the process asymmetry comprises any asymmetry in the target not resultant from an overlay offset between layers.

11. The method of claim 1, wherein the target comprises two structures in different layers and a distance between the two structures in a direction perpendicular to a plane of the substrate is greater than 1 µm.

12. The method of claim 1, wherein the target comprises two structures in different layers and a distance between the two structures in a direction perpendicular to a plane of the substrate is greater than 2 µm.

13. The method of claim 1, further comprising measuring the target with the first radiation to obtain the first image of the target and with the second radiation to obtain the second image of the target.

14. The method of claim 13, wherein the measuring of the target with the first radiation to obtain the first image of the target and with the second radiation to obtain the second image of the target is performed in a single acquisition.

15. The method of claim 1, wherein the characteristic of the target comprises overlay and the method further comprises:
    determining a plurality of intermediate overlays for the target from the plurality of intensity asymmetry measurements, wherein each of the plurality of intermediate overlays is determined for a respective one of the pair of complementary pixels; and
    determining the overlay from the plurality of intermediate overlays.

16. A metrology apparatus comprising:
    an illumination system configured to illuminate with radiation a target; and
    a detection system configured to detect scattered radiation arising from the illumination of the target;
    wherein the metrology apparatus is configured to determine a characteristic of a target on a substrate by:
        determining a plurality of intensity asymmetry measurements, wherein each of the plurality of intensity asymmetry measurements is determined from measured intensities from a respective one of pairs of complementary pixels without averaging the measured intensities,
        wherein each of the pairs of complementary pixels comprises a first image pixel in a first image of the target and a second image pixel in a second image of the target,
        wherein the first image is obtained from first radiation scattered by the target and the second image is obtained from second radiation scattered by the target, and
        wherein the first radiation and second radiation comprise complementary non-zero diffraction orders; and
        determining the characteristic of the target using the plurality of intensity asymmetry measurements of the pairs of complementary pixels.

17. A non-transitory computer program product comprising processor readable instructions that, when run on a processor controlled apparatus, cause the processor controlled apparatus to perform operations for determining a characteristic of a target on a substrate comprising:
    determining a plurality of intensity asymmetry measurements, wherein each of the plurality of intensity asymmetry measurements is determined from measured intensities from a respective one of pairs of complementary pixels without averaging the measured intensities,
    wherein each of the pairs of complementary pixels comprises a first image pixel in a first image of the target and a second image pixel in a second image of the target,
    wherein the first image is obtained from first radiation scattered by the target and the second image is obtained from second radiation scattered by the target, and
    wherein the first radiation and second radiation comprise complementary non-zero diffraction orders; and
    determining the characteristic of the target using the plurality of intensity asymmetry measurements of the pairs of complementary pixels.

18. A non-transitory computer program carrier comprising a computer program comprising processor readable instructions that, when run on a processor controlled apparatus, cause the processor controlled apparatus to perform operations for determining a characteristic of a target on a substrate comprising:
    determining a plurality of intensity asymmetry measurements, wherein each of the plurality of intensity asymmetry measurements is determined from measured intensities from a respective one of a pair of complementary pixels without averaging the measured intensities,
    wherein each of the pairs of complementary pixels comprises a first image pixel in a first image of the target and a second image pixel in a second image of the target, wherein the first image is obtained from first radiation scattered by the target and the second image is obtained from second radiation scattered by the target,
wherein the first radiation and second radiation comprise complementary non-zero diffraction orders; and
determining the characteristic of the target using the plurality of intensity asymmetry measurements of the pairs of complementary pixels.

* * * * *